(12) United States Patent
Solarz et al.

(10) Patent No.: US 11,035,804 B2
(45) Date of Patent: Jun. 15, 2021

(54) SYSTEM AND METHOD FOR X-RAY IMAGING AND CLASSIFICATION OF VOLUME DEFECTS

(71) Applicant: KLA-Tencor Corporation, Milpitas, CA (US)

(72) Inventors: Richard W. Solarz, Danville, CA (US); Oleg Khodykin, San Diego, CA (US); Bosheng Zhang, Milpitas, CA (US); Steven R. Lange, Alamo, CA (US)

(73) Assignee: KLA Corporation, Milpitas, CA (US)

( * ) Notice: Subject to any disclaimer, the term of this patent is extended or adjusted under 35 U.S.C. 154(b) by 65 days.

(21) Appl. No.: 15/636,614

(22) Filed: Jun. 28, 2017

(65) Prior Publication Data

US 2019/0003988 A1 Jan. 3, 2019

Related U.S. Application Data

(60) Provisional application No. 62/525,932, filed on Jun. 28, 2017.

(51) Int. Cl.
*G01N 21/956* (2006.01)
*G01N 21/47* (2006.01)
(Continued)

(52) U.S. Cl.
CPC ... *G01N 21/95607* (2013.01); *G01N 21/4788* (2013.01); *G01N 23/04* (2013.01);
(Continued)

(58) Field of Classification Search
CPC .......... G01N 21/4788; G01N 21/9505; G01N 21/95607; G01N 23/04; G01N 23/207; G06T 7/0006; H01L 22/12
See application file for complete search history.

(56) References Cited

U.S. PATENT DOCUMENTS

| 5,561,293 A | * | 10/1996 | Peng | ................. | H01J 37/3005 |
| | | | | | 250/307 |
| 6,118,849 A | | 9/2000 | Tanimori et al. | | |

(Continued)

FOREIGN PATENT DOCUMENTS

EP 3032243 A1 6/2016

OTHER PUBLICATIONS

International Search Report and Written Opinion dated Oct. 25, 2018 for PCT/US2018/039199.
(Continued)

*Primary Examiner* — Manuchehr Rahmjoo
(74) *Attorney, Agent, or Firm* — Suiter Swantz pc llo

(57) ABSTRACT

X-ray imaging and classification of volume defects within a three-dimensional structure includes identifying one or more volume defects within a three-dimensional structure of a sample and acquiring, with a transmission-mode x-ray diffraction imaging tool, one or more coherent diffraction images of the one or more identified volume defects. The process includes classifying the one or more volume defects within a volume of the three-dimensional structure based on the one or more coherent diffraction images, and training an additional optical or electron-based inspection tool based on the one or more classified defects.

51 Claims, 5 Drawing Sheets

(51) Int. Cl.
*G01N 23/207* (2018.01)
*G01N 23/04* (2018.01)
*G06T 7/00* (2017.01)
*H01L 21/66* (2006.01)
*G01N 21/95* (2006.01)

(52) U.S. Cl.
CPC ......... *G01N 23/207* (2013.01); *G06T 7/0006* (2013.01); *H01L 22/12* (2013.01); *H01L 22/20* (2013.01); *G01N 21/9505* (2013.01)

(56) References Cited

U.S. PATENT DOCUMENTS

| | | | |
|---|---|---|---|
| 6,292,260 | B1 | 9/2001 | Lin et al. |
| 6,548,811 | B1* | 4/2003 | Nakamura ............... H01J 37/26 250/306 |
| 7,430,898 | B1* | 10/2008 | Weber-Grabau ....... G01Q 10/06 73/105 |
| 8,380,003 | B2 | 2/2013 | Rad et al. |
| 8,765,496 | B2 | 7/2014 | Nasser-Ghodsi et al. |
| 8,912,495 | B2 | 12/2014 | Lange |
| 9,297,645 | B2 | 3/2016 | Schonleber |
| 9,318,395 | B2 | 4/2016 | Campochiaro et al. |
| 10,082,470 | B2 | 9/2018 | Shortt et al. |
| 2005/0185173 | A1* | 8/2005 | Hau-Riege ............ B82Y 10/00 356/237.5 |
| 2011/0075134 | A1 | 3/2011 | Uto et al. |
| 2015/0260660 | A1 | 9/2015 | Lange |
| 2016/0202193 | A1 | 7/2016 | Hench et al. |
| 2017/0031246 | A1 | 2/2017 | Den Boef |
| 2017/0045823 | A1* | 2/2017 | Quintanilha ............ G03F 1/24 |

OTHER PUBLICATIONS

Rad, Leili Baghaei, et al., "X-ray diffraction microscopy: Reconstruction with partial magnitude and spatial a priority information", Journal of Vaccum Science & Technology B, Nanotechnology and Microelectronics: Materials, Processing, Measurement, and Phenomena, Dec. 2008, 8 pages, vol. 26—Issue 6, AVS: Science & Technology of Materials, Interfaces, and Processing, Stanford, California.

Thibault, P. & Menzel, A., "Reconstructing state mixtures from diffraction measurements", Nature 494, Feb. 7, 2013, pp. 68-71, Nature Publishing Group.

Zhang B. et al., "Plychographic hyperspectral spectromicroscopy with an extreme ultraviolet high harmonic comb", Opt. Express 24, 18745, Aug. 8, 2016, 10 pages, Boulder, Colorado.

U.S. Appl. No. 15/430,817, filed Feb. 13, 2017, KLA-Tencor.

* cited by examiner

SYSTEM AND METHOD FOR X-RAY IMAGING AND CLASSIFICATION OF VOLUME DEFECTS

CROSS-REFERENCE TO RELATED APPLICATION

The present application claims the benefit under 35 U.S.C. § 119(e) of U.S. Provisional Application Ser. No. 62/525,932, filed Jun. 28, 2017, entitled HIGH SPEED OPTICAL LOCATION AND X-RAY IMAGING AND CLASSIFICATION OF DEFECTS IN 3D VERTICAL MEMORY, naming Richard W. Solarz, Oleg Khodykin, Bosheng Zhang, and Steven R. Lange as inventors, which is incorporated herein by reference in the entirety.

TECHNICAL FIELD

The present invention generally relates to sample inspection and defect classification, and, more particularly, to imaging and classification of defects located within the volume of a three-dimensional structure with an x-ray imaging system and the training of an in-line monitoring tool using the results from the x-ray imaging system.

BACKGROUND

Three-dimensional memory devices, such as three-dimensional vertical memory devices, now represent a significant portion of the flash memory market. Virtually all defect locations for these vertical devices are located below the surface of the device and cannot be reviewed with the SEM review tools for verification of defect type and depth. The current method for classifying defects in three-dimensional vertical memory structures involves first inspecting the wafer with one of the inspection tools and then selecting a set of defects that should be classified to identify the cause of the defects and to separate "nuisance defects" from real defects of interest. The defect locations are marked on the surface by a variety of methods, such as, SEM burn marks, focused laser beams that melt the materials to leave a small spot, mechanical indenters or AFM marks, or scribe tools. Then, the wafer with the marked sites is brought back to the inspection tool that identified the defects and the defect site is imaged using the inspection recipe and the image with the marks is processed to obtain the offsets from the marks to the defect location. In turn, the wafer with the set of defects and their offset from the marks is moved to a focused ion beam (FIB) tool to expose the region of the wafer or die which has been identified by the inspection tool, such as a near IR (NIR) bright field tool, as potentially containing a defect of interest. A side-view SEM tool is then used to image the suspected defect site, which has been exposed by the FIB. The defect is then either identified as a defect of interest (with its location, size, depth, the chance of it being a killer defect recorded), or as a nuisance event defect. The FIB technique may remove materials along a trench about 10 nm at a time. After each 10 nm FIB cut the side viewing SEM may obtain an image of the exposed area. This process is repeated until the defect is exposed or a large enough cut is taken that the defect should have been located. The current approach takes over 30 minutes to perform for each defect and involves transferring the wafer between multiple tools and may require a large number of wafers or die to complete the identification of all defects. Therefore, it would be desirable to provide a method and system that cures the shortcomings of the prior approaches outlined above.

SUMMARY

An x-ray inspection tool for defect imaging and classification is disclosed, in accordance with one or more embodiments of the present disclosure. In one embodiment, the x-ray inspection tool includes an x-ray source. In another embodiment, the x-ray inspection tool includes an x-ray detector. In another embodiment, the x-ray source and the x-ray detector are arranged in transmission mode and configured to measure one or more x-ray diffraction patterns from one or more volume defects contained within a three-dimensional structure of a sample. In another embodiment, the x-ray inspection tool includes one or more controllers including one or more processors communicatively coupled to the x-ray detector. In another embodiment, the one or more processors are configured to execute program instructions configured to cause the one or more processors to classify the one or more volume defects based on at least one of the one or more x-ray diffraction patterns or one or more coherent diffraction images reconstructed from the one or more x-ray diffraction patterns. In another embodiment, the one or more processors are further configured to train one or more additional inspection tools based on the one or more classified volume defects.

A system for x-ray imaging and classification of defects is disclosed, in accordance with one or more embodiments of the present disclosure. In one embodiment, the system includes an x-ray inspection sub-system. In another embodiment, the x-ray inspection sub-system includes an x-ray source and x-ray detector arranged in transmission mode and configured to measure one or more x-ray diffraction patterns from one or more volume defects contained within a three-dimensional structure of a sample. In another embodiment, the system includes an additional inspection tool. In another embodiment, the system includes one or more controllers including one or more processors communicatively coupled to the x-ray detector and the additional inspection tool. In another embodiment, the one or more processors are configured to execute program instructions configured to cause the one or more processors to classify the one or more volume defects based on at least one of the one or more x-ray diffraction patterns or one or more coherent diffraction images reconstructed from the one or more x-ray diffraction patterns.

A method for x-ray imaging and classification of defects is disclosed, in accordance with one or more embodiments of the present disclosure. In one embodiment, the method includes identifying one or more volume defects within a three-dimensional structure of a sample. In another embodiment, the method includes acquiring, with a transmission-mode x-ray diffraction imaging tool, one or more coherent diffraction images of the one or more identified volume defects. In another embodiment, the method includes classifying the one or more volume defects within a volume of the three-dimensional structure based on the one or more coherent diffraction images. In another embodiment, the method includes training an additional inspection tool based on the one or more classified defects.

A method for x-ray imaging and classification of defects is disclosed, in accordance with one or more embodiments of the present disclosure. In one embodiment, the method includes identifying one or more volume defects within a three-dimensional structure of a sample. In another embodiment, the method includes acquiring, with a transmission-mode x-ray diffraction imaging tool, one or more x-ray diffraction patterns of the one or more identified volume defects. In another embodiment, the method includes classifying the one or more volume defects within a volume of the three-dimensional structure based on the one or more x-ray diffraction patterns. In another embodiment, the method includes training an additional inspection tool based on the one or more classified defects.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 3, a system and method for x-ray imaging and classification is described in accordance with the present disclosure.

Embodiments of the present disclosure are directed to a system and method for imaging and classifying volume defects in three-dimensional structures, such as vertical memory structures, in semiconductor devices. For the purposes of the present disclosure, a volume defect is a defect located or embedded within a volume of a three-dimensional structure and not at the surface of the three-dimensional structure. Embodiments of the present disclosure utilize hard x-rays in transmission mode to obtain coherent diffractive images and/or x-ray diffraction patterns from volume defects within the three-dimensional structures. The utilization of the hard x-ray characterization procedure of the present disclosure allows defects to be imaged to better than 10 nm resolution in x, y, and z directions for fast classification following prior localization of the defects via another source (e.g., additional inspection tool, design data, etc.). Additional embodiments are directed to the training of an additional inspection tool, which operates much faster than the x-ray imaging tool of the present disclosure, using the classification information gathered from the x-ray inspection process. Once trained, the additional inspection tool may monitor and maintain the process yield during high volume manufacturing.

It is noted that the use of coherent diffractive imaging in the context of soft x-rays is described in U.S. Patent Publication No. 2017/0045823, published on Feb. 16, 2017, which is incorporated herein by reference in the entirety. The use of coherent diffractive imaging to perform metrology measurements is described in U.S. Patent Publication No. 2017/0031246, published on Feb. 2, 2017, which is incorporated herein by reference in the entirety.

Figure 1A:
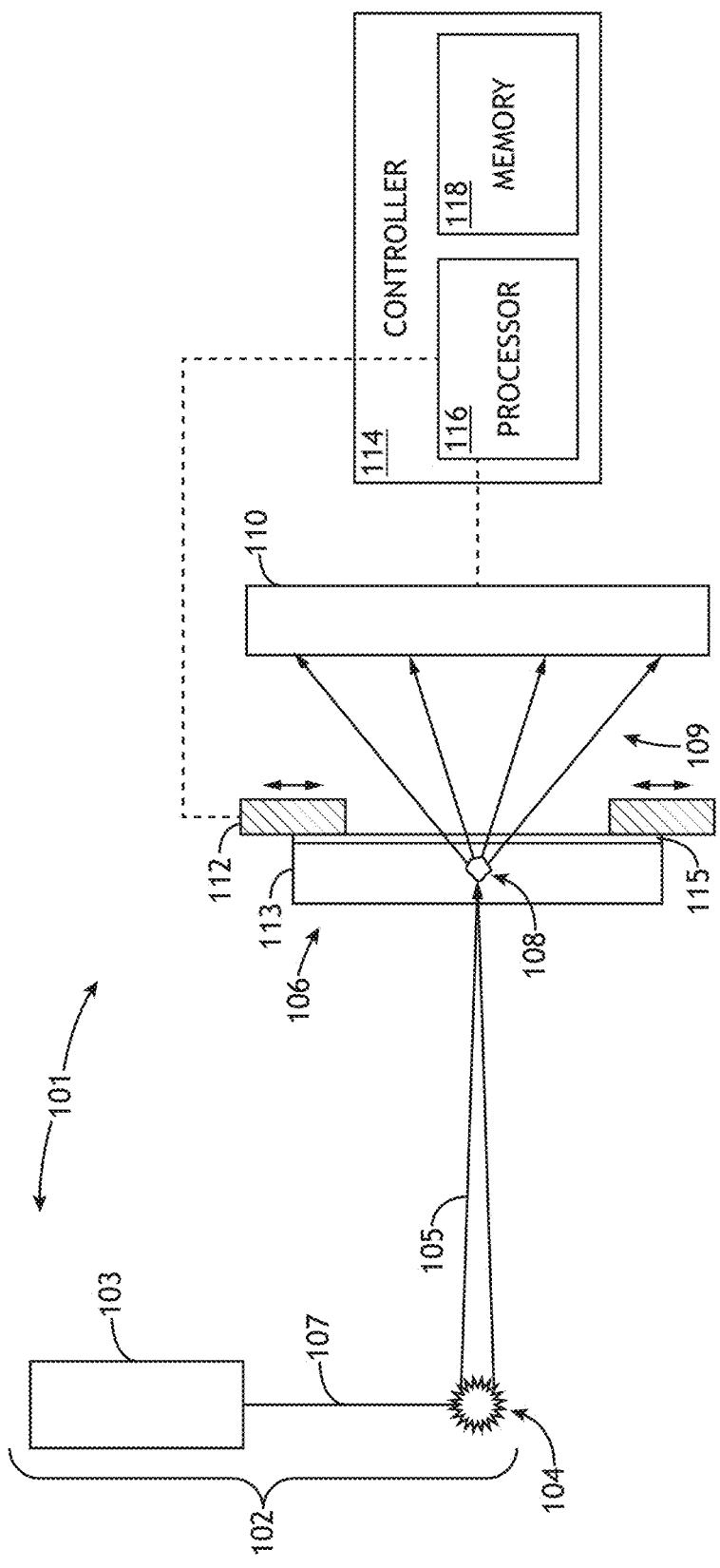
FIG. 1A is a block diagram view of a system for x-ray imaging and classification of volume defects in a three-dimensional structure, in accordance with one or more embodiments of the present disclosure.
Figure 1B:
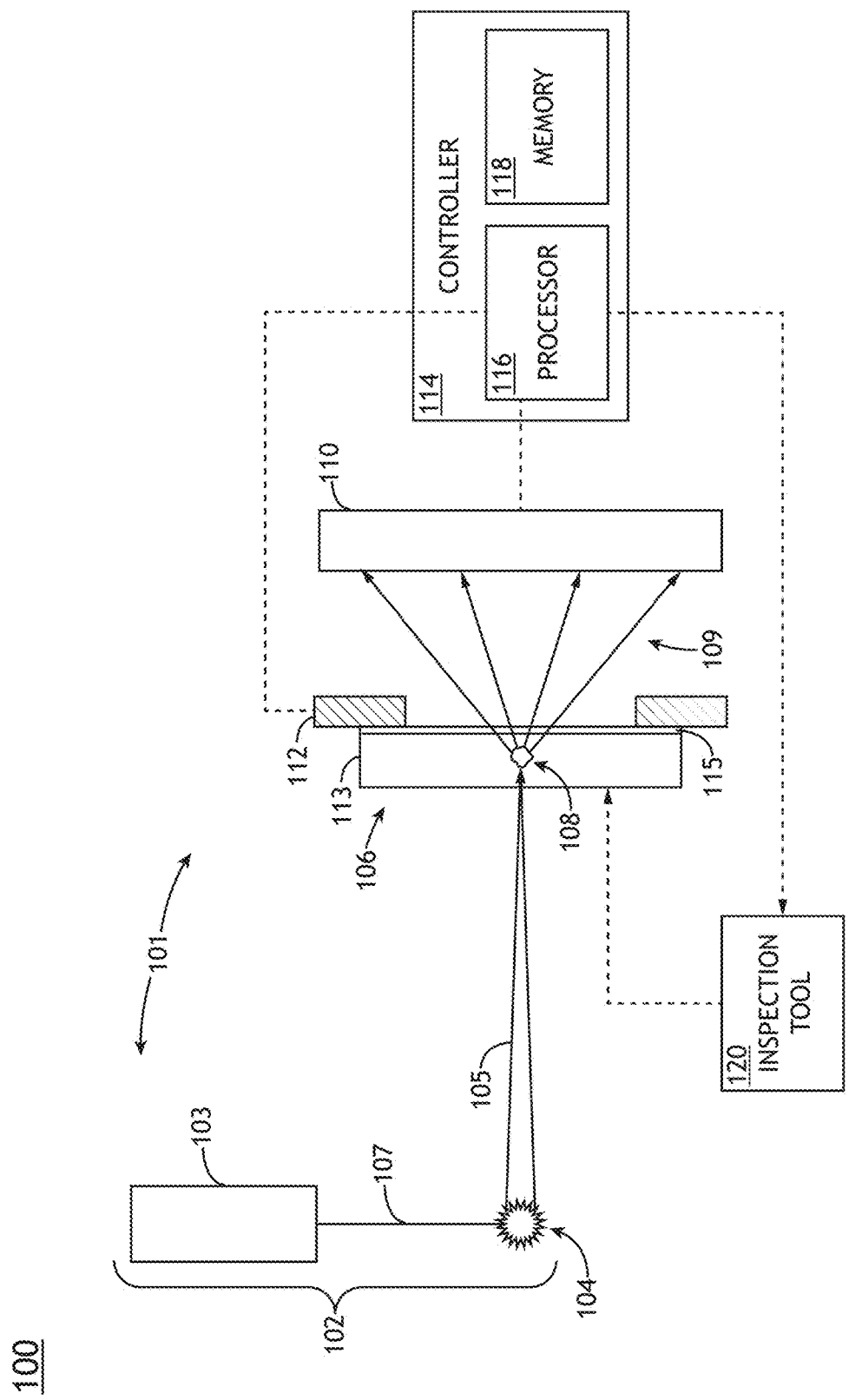
FIG. 1B is a block diagram view of a system for x-ray imaging and classification of volume defects in a three-dimensional structure, in accordance with one or more embodiments of the present disclosure.

FIGS. 1A-1B illustrate block diagram views of an inspection tool or system 100 for x-ray imaging and classification of volume defects, in accordance with one or more embodiments of the present disclosure.

It is noted herein that system 100 may be used to inspect and classify any volume defects known in the art of semiconductor device manufacture. For example, the system 100 may be used to inspect and classify any type of volume defect embedded in a three-dimensional structure. Such three-dimensional structures may include, but are not limited to, a three-dimensional vertical memory structure (e.g., three-dimensional flash memory stack/VNAND memory stack). In some embodiments, the three-dimensional structures may include a number of stacked layers having a thickness of up to approximately 10 µm. The three-dimensional structures may be formed from $SiO_2$, $Si_3N_4$, poly silicon, amorphous silicon, W or similar light atom compounds or heavy atom materials/metals. The system 100 may be used to characterize any number of defects of interest of a three-dimensional structure, such as, but not limited to, a material void, a volume of residue material, extraneous material, a metrologic variation, and any other variations of interest.

While the remainder of the present disclosure focuses on the implementation of system 100 in the context of a three-dimensional vertical memory structure, it is noted herein that the scope of the present disclosure is not limited to such an implementation, which is provided merely for illustrative purposes.

In one embodiment, the system 100 includes an x-ray inspection sub-system 101, and a controller 114. In another embodiment, as shown in FIG. 1B, the system 100 includes one or more additional inspection tools 120. In one embodiment, the x-ray inspection sub-system 101 acquires x-ray diffraction patterns 109 from the volume defects 108 embedded in a three-dimensional structure 113 of sample 106. In another embodiment, the controller 114 may reconstruct coherent diffraction images from the acquired x-ray diffraction patterns 109 of the one or more volume defects 108. Based on the reconstructed coherent diffraction images and/or the received x-ray diffraction patterns 109, the controller 114 may classify the one or more volume defects 108. In another embodiment, as depicted in FIG. 1B, the controller 114 may then train the one or more additional inspection tools 120 (e.g., near IR inspection tool, e-beam inspection tool, UV/DUV inspection tool, etc.) based on the classification of the volume defects 108. In this regard, the controller 114 (or another controller/computer) may correlate responses of the one or more additional inspection tools 120 with the classification (e.g., depth or type of defects) performed by the x-ray inspection sub-system 101. For example, several inspection recipes on an inspection tool may find different sets of possible defects located at various depths. For instance, a defect of interest may be located at a particular depth. Following the x-ray verification, one or more of the possible recipes may be discovered as superior at identifying these defects at the desired depth. In this case, such a recipe may be used for future inspection of that particular defect type. Following training, the one or more additional inspection tools 120 may then be used to monitor and/or maintain yield on a three-dimensional semiconductor device (e.g., three-dimensional vertical memory) fabrication facility.

In one embodiment, the x-ray inspection sub-system 101 is a transmission-mode x-ray inspection sub-system. It is noted that the x-ray inspection sub-system 101 may include any number and type of components necessary to carry out transmission-mode x-ray inspection of the one or more volume defects 108 within sample 106 and is not limited to the following configurations, which are provided merely for illustrative purposes.

In one embodiment, the x-ray inspection sub-system 101 includes an x-ray source 102 configured to generate one or more x ray beams 105, an x-ray detector 110 and a sample stage 112 configured to secure a three-dimensional sample 106 containing one or more volume defects 108.

In one embodiment, the x-ray source 102 and the x-ray detector 110 are arranged in transmission mode. In this regard, the x-ray source 102 transmits the x-ray beam 105 through the sample 106 and the detector 110 collects x-rays scattered from the sample 106. In cases where the x-ray beam 105 impinges on a volume defect 108, the x-ray detector 110 collects/measures the one or more x-ray diffraction patterns 109 caused by the one or more volume defects 108 contained within the three-dimensional structure 113 of sample 106.

In one embodiment, the x-ray source 102 is a hard x-ray source configured for forming a spatially coherent hard x-ray beam. For example, the x-ray beam 105 may include x-rays having energies between approximately 3 to 20 keV. For instance, the x-ray beam 105 may include x-rays having energies between approximately 5 and 6 keV.

The x-ray source 102 may include any x-ray source known in the art. In one embodiment, the x-ray source 102 is a laser produced plasma (LPP) x-ray source. For example, the x-ray source 102 may include a laser source 103 configured to generate a laser beam 107 for pumping plasma 104. Responsive to the laser radiation, the plasma 104 may produce a spatial coherent x-ray beam 105. In one embodiment, the laser source 103 is a high energy pulse laser configured to generate very short pulses of laser illumination. For example, the pulse laser may generate laser pulses having widths less than 500 ps. For instance, the pulse laser may generate laser pulses having widths as narrow as 1 ps. Such lasers may include, but are not limited to, a high power mode locked laser or a chirped pulse amplified laser. In another embodiment, the laser produced plasma may produce an x-ray beam 105 having a spatial coherence between approximately 1 and 10 µm. For example, the laser produced plasma may produce an x-ray beam 105 having a spatial coherence of approximately 5 µm. In some embodiments, the x-ray source 102 may include any number of conditioning elements configured to improve the coherence of the x-ray beam 105. For example, the x-ray source 102 may include, but is not limited to, one or more x-ray optics for capturing, refocusing, spatial filtering and/or conditioning the x-ray output from the plasma 104 to achieve a desired level of spatial coherence.

It is noted that the scope of the present disclosure is not limited to an LPP-based x-ray source 102, which is provided for purposes of illustration. Rather, it is recognized herein that the various embodiments of the present disclosure may incorporate any x-ray source 102 known in the art. For example, the x-ray source 102 may include, but is not limited to, a Compton x-ray source.

In one embodiment, upon receiving a location of one or more volume defects 108, the x-ray source 102 may illuminate a selected region of the sample 106 corresponding to the known or suspected volume defects. For example, the x-ray source 102 may illuminate an area of approximately 1 to 25 sq. µm at the location of each of the known or suspected volume defects. For instance, the x-ray source 102 may illuminate an area of approximately 2 µm by 2 µm at the location of each of the known or suspected volume defects as identified by another source (e.g., NIR tool, e-beam tool, UV/DUV tool, design data, and the like).

The sample stage 112 may include any sample stage know in the art suitable for securing the sample 106 in a transmission-mode inspection configuration. For example, the sample stage 112 may include, but is not limited to, an actuatable sample stage for selectively actuating the sample 106 relative to the x-ray beam 105 and/or an inspection beam of an additional inspection tool 120. For instance, the sample stage 112 may include, but is not limited to, a linear sample stage, a rotational sample stage, or a combination of a rotational sample stage and a linear sample stage.

In one embodiment, the substrate 115 of the sample 106 may be back-thinned. For example, a silicon substrate of the sample 106, which commonly has a thickness of approximately 700 µm, may be back-thinned to a selected thickness. For instance, the substrate 115 of sample 106 may be back-thinned to a thickness less than 20 µm. The substrate 115 may be back-thinned by any means known in the art, such as, but not limited to, an etching or polishing process. It is noted that because the substrate 115 (e.g., silicon wafer) absorbs x-rays the back-thinning of the substrate 115 provides for adequate transmission of x-rays through the substrate 115 for detection of x-ray diffraction patterns 109 from the volume defects 108 and the rest of the three-dimensional structure 113 on the sample 106. It is further noted that, in instances where the energy of the x-ray beam 105 is sufficiently high, back-thinning of the substrate 115 may not be necessary. In this case, the x-ray beam 105 may be transmitted through the full thickness (e.g., 700 µm) of the substrate 115, such as a silicon wafer.

The one or more detectors 110 may include any detector or sensor known in the art of inspection suitable for detecting x-rays and x-ray diffraction patterns 109. For example, the detector 110 of the inspection sub-system 101 may include, but is not limited to, one or more x-ray CCD detectors.

In one embodiment, the controller 114 is communicatively coupled to the x-ray inspection sub-system 101. For example, the controller 114 may be coupled to the output of one or more detectors 110 of the x-ray inspection sub-system 101. The controller 114 may be coupled to the one or more detectors 110 in any suitable manner (e.g., by one or more transmission media indicated by the line shown in FIGS. 1A-1B) such that the controller 114 can receive x-ray diffraction patterns 109 (or one or more signals indicative of the x-ray diffraction patterns) acquired from the one or more volume defects 108 of sample 106 by the one or more x-ray detectors 110.

In one embodiment, the controller 114 includes one or more processors 116. In one embodiment, the one or more processors 116 are configured to execute a set of program instructions stored in memory 118.

In one embodiment, the program instructions are configured to cause the one or more processors 116 to receive a location associated with the one or more volume defects within the three-dimensional structure 113 of the sample 106. The one or more processors 116 may receive the location of one or more known or suspect volume defects 108 from any number of sources. In one embodiment, the one or more processors 116 may receive the location of one or more known or suspect volume defects 108 from an additional inspection tool 120. In this regard, the additional inspection tool 120 provides for high speed location of known or suspected volume defects 108. The location of the known or suspected defects 108 may then be transferred from the additional inspection tool 120 to the controller 114 of the x-ray inspection sub-system 101. The location information associated with the known or suspected defects may be stored in memory 118 of controller 114 and/or the memory of the additional inspection tool 120 and later transferred to controller 114.

The additional inspection tool 120 may include any inspection tool known in the art of defect inspection. For example, the additional inspection tool 120 may include, but is not limited to, a brightfield or a darkfield inspection tool. For instance, the additional inspection tool 120 may include, but is not limited to, an NIR brightfield or darkfield inspection tool or a visible/UV/DUV brightfield or darkfield inspection tool. By way of another example, the additional inspection tool 120 may include, but is not limited to, an electron-beam inspection tool.

In another embodiment, the one or more processors 116 may receive the location of one or more known or suspect volume defects 108 from design data associated with the three-dimensional structure 113 of the sample 106. For example, the one or more processors 116 may receive a design file including known or suspected hotspots within the three-dimensional structure 113. Hotspot information may be stored in a design file, such as but not limited to, an Oasis file, a GDSII file, and the like. The hotspot information, serving to identify known or suspected defects in the three-dimensional structure 113, may be stored in the memory 118 of controller 114 and/or the memory of an additional controller/computer which is communicatively coupled to the controller 114.

In another embodiment, the program instructions are configured to cause the one or more processors 116 to direct the x-ray inspection sub-system 101 to acquire one or more x-ray diffraction patterns 109 at the locations associated with the one or more volume defects 108.

Figure 1C:
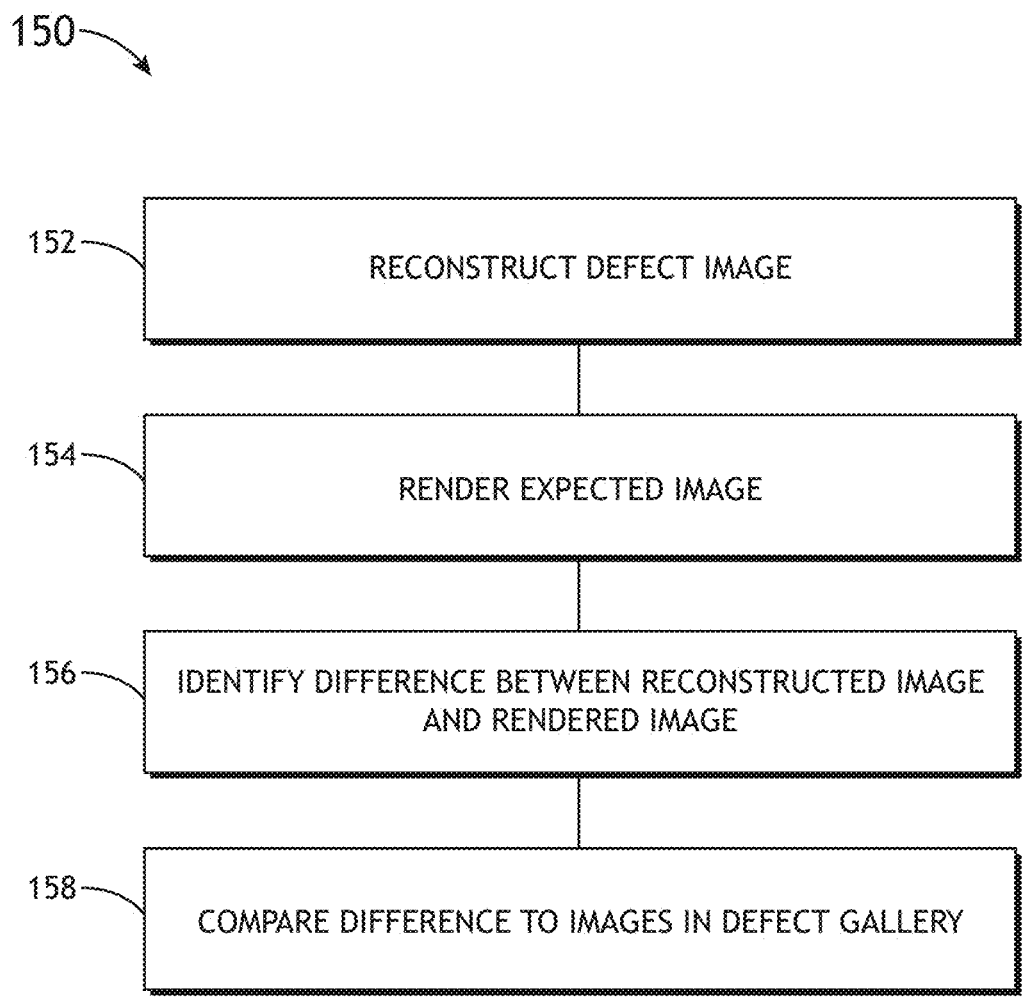
FIG. 1C is a process flow diagram depicting a method of classifying one or more volume defects contained within a three-dimensional structure, in accordance with one embodiment of the present disclosure.

In another embodiment, the program instructions are configured to cause the one or more processors 116 to classify the one or more volume defects 108. In one embodiment, the one or more volume defects 108 may be classified based on one or more coherent diffraction images reconstructed from the one or more x-ray diffraction patterns. FIG. 1C illustrates a process flow diagram depicting a method 150 of classifying the one or more volume defects 108, in accordance with one or more embodiments of the present disclosure.

In step 152, after acquiring the one or more x-ray diffraction patterns 109, the program instructions may cause the one or more processors 116 to carry out an image reconstruction routine on the one or more x-ray diffraction patterns 109 to generate one or more coherent diffraction images of the one or more identified volume defects 108. In this regard, the one or more processors 116 may perform a transformation that converts the collected x-ray diffraction patterns 109 to their corresponding real structure. It is noted that any image reconstruction algorithms known in the art of x-ray transmission imaging, such as, but not limited to, one or more phase-retrieval algorithms may be used to carry out the image reconstruction.

In another embodiment, for a particular volume defect 108, multiple x-ray diffraction patterns 109 may be obtained by the x-ray inspection sub-system 101. For example, for a particular volume defect 108, a set of x-ray diffraction patterns 109 may be obtained, whereby each x-ray diffraction pattern 109 is obtained at a different angle of incidence (e.g., every 30 degrees). In this regard, the three-dimensional information associated with the particular volume defect 108 may be abstracted from the collective diffraction images acquired from the particular location. In one embodiment, less than ten views, taken at different angles of incidence, are necessary to form a reconstructed image. In this regard, the number of views acquired may be minimized to the number of views necessary to form a reconstructed image, which reduces the time of the overall classification of the particular defect. It is noted that the number of views may include any number necessary to acquire a suitable reconstructed image. For example, the number of views may range from 90 views (e.g., 1 view every 1 degree) down to 3 views (e.g., 1 view every 30 degrees). It is noted that this range of views is not a limitation on the scope of the present disclosure and is provided merely for illustrative purposes.

In step 154, the program instructions may cause the one or more processors 116 to render one or more expected images associated with the three-dimensional structure 113 at the location of the one or more volume defects 108. In this regard, the one or more processors 116 may simulate the expected or desired image associated with the three-dimensional structure 113 at the location of the one or more volume defects 108 assuming that the volume defects are not present. In one embodiment, the one or more processors 116 may first simulate one or more expected x-ray diffraction patterns 109 associated with the three-dimensional structure 113 for each location of the one or more volume defects 108. Then, the one or more processors 116 may carry out a transformation of the simulated x-ray diffraction patterns 109 to achieve the expected or simulated real images associated with the three-dimensional structure 113 at the location of the one or more volume defects 108 (assuming that the volume defects are not present).

In one embodiment, the one or more processors 116 may simulate the expected x-ray diffraction patterns 109 associated with the three-dimensional structure 113 utilizing one or more characteristics of the x-ray inspection sub-system 101 (e.g., x-ray source 102, detector 110, etc.) and/or the design data associated with the three-dimensional structure 113. The design data may be stored in a design file (e.g., an Oasis file, a GDSII file, and the like) in memory 118 (or another memory). In this regard, for a particular location of the three-dimensional structure 113 associated with an identified volume defect 108, the one or more processors 116 may simulate an x-ray diffraction pattern based on the design information contained within the design file for that portion of the three-dimensional structure 113. This simulation process may be carried out with the assumption that no defect is present at the particular location.

In one embodiment, using composition and topology information of the three-dimensional structure 113, the electric field at the exit plane of the three-dimensional structure 113 can be calculated. Then, diffraction formulas, such as, but not limited to, the Raleigh-Sommerfeld diffraction integral or the Fresnel diffraction integral, can be applied to calculate the electric field on the detector 110 after propagating through the space between the exit plane of the three-dimensional structure 113 and the detector 110. In another embodiment, the diffraction formulas can be approximated by Fast Fourier Transforms.

In step 156, the program instructions cause the one or more processors to identify one or more differences between the reconstructed images of step 152 and the rendered expected images of step 154. In one embodiment, the one or more differences between the reconstructed images and the rendered expected images are identified by comparing the rendered expected images to the one or more reconstructed coherent diffraction images. For example, the comparison between the reconstructed images and the rendered expected images may be carried out with any image comparison/differencing algorithms known in the art of image analysis.

In step 158, the program instructions cause the one or more processors 116 to compare the identified difference between the reconstructed images and the rendered expected images to a set of images contained within an expected defect image gallery. For example, the expected defect image gallery may include a set of images of possible defects that may be present in the three-dimensional structure 113. The gallery may include images of, but is limited to, images of material voids, images of residue material, images of extraneous material, and images of metrologic variations. In addition, the gallery may include images of the various defect types obtained at multiple views (i.e., multiple angles of beam incidence) and from multiple depths within the three-dimensional structure 113. In another embodiment, the one or more processors 116 may compare a given difference image identified in step 156 to the images within the gallery in order to find a best match between the difference image and an image in the image gallery. Based on the identified best match, the one or more processors may then assign the measured difference of step 156 to the matched defect in the gallery.

It is noted that the system 100 may extract various characteristics associated with a particular volume defect. For example, the system 100 may acquire depth (i.e., Z-position) and/or the type of a particular defect based on the measurement and classification procedure described previously herein. It is further noted that the x-ray inspection sub-system 101 is capable of acquiring multiple views at different angles of x-ray incidence of a particular volume defect 108. In this case, the one or more processors 116 may then segment the particular defect according to depth, localizing the Z-position of the defect 108 by analyzing the multiple views of the defect 108.

In another embodiment, the classification process described above may be carried out by identifying a difference between the one or more simulated x-ray diffraction patterns and the one or more measured x-ray diffraction patterns. In this embodiment, once a difference in diffraction patterns is identified, the one or more processors 116 may apply one or more reconstruction algorithms (e.g., one or more phase retrieval algorithms) on the pattern difference to form a reconstructed image of a particular defect. This reconstructed image may then be used in conjunction with the defect image gallery to classify the particular defect.

In another embodiment, the classification process may be performed by bypassing image reconstruction. In this embodiment, the one or more processors 116 may identify a difference between the one or more simulated x-ray diffraction patterns and the one or more measured x-ray diffraction patterns. In this embodiment, once the pattern difference has been identified, it may be compared to a set of expected defect patterns contained within a gallery of x-ray diffraction patterns. For example, the expected defect pattern gallery may include a set of x-ray diffraction patterns associated with possible defects that may be present in the three-dimensional structure. The gallery may include patterns associated with material voids, residue material, extraneous material, and metrologic variations. In addition, the gallery may include patterns of the various defect types obtained at multiple views and from multiple depths within the three-dimensional structure 113.

In another embodiment, the program instructions are configured to cause the one or more processors 116 to train the additional inspection tool 120. For example, the one or more processors 116 may train the additional inspection tool 120 based on the one or more classified volume defects 108. For instance, the one or more processors 116 may train the additional inspection tool 120 based on the one or more classified volume defects 108 classified in steps 152-158 of process 150.

In one embodiment, the one or more processors 116 of controller 114 may train the additional tool 120 by correlating measurements of one or more suspected or known volume defects 108 obtained with the additional tool 120 with the measurements of one or more suspected or known volume defects 108 obtained with the x-ray inspection sub-system 101. For example, in the case where the locations of the suspected or known volume defects are first identified with the additional inspection tool 120, the one or more processors 116 may correlate the measurement results associated with those measurements and the x-ray images obtained from the three-dimensional structure 113 at the same locations. By way of another example, in the case where the locations of the suspected or known volume defects are first identified using design data (e.g., hotspot identification), the one or more processors 116 may direct the additional tool 120 to obtain measurements from the locations of the suspected or known defects. Then, the one or more processors may correlate the measurement results associated with the measurements from the additional inspection tool 120 and the x-ray images obtained from the three-dimensional structure 113 at the same locations.

For instance, in the case where depth (Z-location) of the volume defects 108 has been measured using the x-ray inspection sub-system 101, the one or more processors 116 may correlate these depth results with measurement signatures from the additional tool 120. In this regard, the signatures from the additional tool 120 may then be used to indicate depth of volume defects 108 which are measured by the additional inspection tool 120 in the future. As a result, the system 100 may carry out depth measurements utilizing the faster lower-resolution additional inspection tool 120, while leveraging the higher-resolution information gathered via the x-ray inspection sub-system 101.

It is noted that while the training process has been described as being implemented with the one or more processors 116 of controller 114, this example is provided merely for illustrative purposes. It is noted that all or part of the training process may be carried out by any processing architecture. For example, the controller 114 may transmit x-ray measurements from the x-ray inspection sub-system 101 to the controller (not shown) of the additional tool 120. In this example, the additional tool may carry out the training process as described above. By way of another example, the controller 114 may transmit x-ray measurements from the x-ray inspection sub-system 101 to a centralized controller and the additional tool 120 may transmit measurement results to the centralized controller. In this example, the centralized controller may carry out the training process as described above.

It is noted that for the purposes of the present disclosure the terms "x-ray inspection sub-system" and "x-ray inspection tool" are used interchangeably. In this regard, the x-ray inspection sub-system/tool may be arranged in a stand-alone configuration as a stand-alone x-ray inspection tool (e.g., see FIG. 1A). Alternatively, the x-ray inspection sub-system/tool may be arranged in a clustered configuration as a sub-system to the larger system 100 (e.g., see FIG. 1B), which includes the additional tool 120 and/or a back-thinning tool (not shown).

In another embodiment, the spatial and/or temporal coherence of the x-ray inspection sub-system 101 may be reduced by utilizing an increased number of measurements. For example, it is noted that one or more ptychography algorithms may be implemented in order to decouple the coherent components of the x-ray beam 105 in situations where there are adequate diffraction conditions measured (e.g., scanning conditions, illumination angles, wavefront modulation, etc.). The implementation of partial spatial coherence and the reconstruction of state mixtures from diffraction measurements is described in Thibault, P. & Menzel, A., *Reconstructing state mixtures from diffraction measurements*, Nature 494, 68-71 (2013), which is incorporated herein by reference in the entirety. The implementation of partial temporal coherence (multiple wavelengths/emission lines) is described in Zhang, B. et al., *Ptychographic hyperspectral spectromicroscopy with an extreme ultraviolet high harmonic comb.*, Opt. Express 24, 18745 (2016), which is incorporated herein by reference in the entirety.

The one or more processors 116 of controller 114 may include any one or more processing elements known in the art. In this sense, the one or more processors 116 may include any microprocessor-type device configured to execute software algorithms and/or instructions. In one embodiment, the one or more processors 116 may be embodied as a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 118. Moreover, different subsystems of the system 100 (e.g., x-ray inspection sub-system 101, additional inspection tool 120, a user interface, and the like) may include processor or logic elements suitable for carrying out at least a portion of the steps described throughout the present disclosure. Therefore, the above description should not be interpreted as a limitation on the present disclosure but merely an illustration.

The memory 118 may include any storage medium known in the art suitable for storing program instructions executable by the associated one or more processors 116. For example, memory 118 may include a non-transitory memory medium. For instance, the memory 118 may include, but is not limited to, a read-only memory, a random access memory, a magnetic or optical memory device (e.g., disk), a magnetic tape, a solid state drive, and the like. In another embodiment, the memory 118 is configured to store one or more results from the x-ray inspection sub-system 101, the additional inspection tool 120, and/or the output of the various steps described herein. It is further noted that memory 118 may be housed in a common controller housing with the one or more processors 116. In an alternative embodiment, the memory 118 may be located remotely with respect to the physical location of the processors and controller 114. For instance, the one or more processors 116 of controller 114 may access a remote memory (e.g., server), accessible through a network (e.g., internet, intranet and the like). In another embodiment, the memory 118 maintains program instructions for causing the one or more processors 116 to carry out the various steps described through the present disclosure.

The embodiments of the system 100 illustrated in FIGS. 1A-1C may be further configured as described herein. In addition, the system 100 may be configured to perform any other step(s) of any of the method embodiment(s) described herein.

Figure 2:
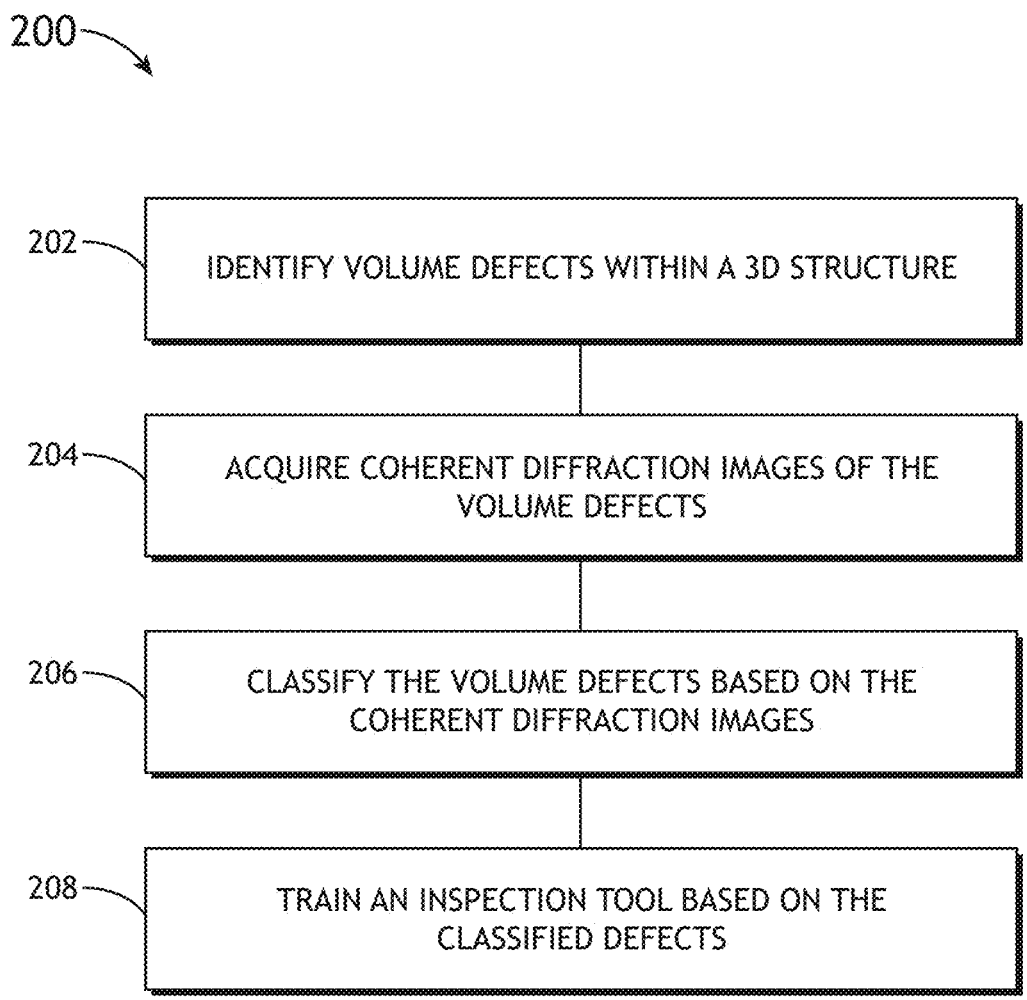
FIG. 2 is a process flow diagram depicting a method of training an inspection tool using x-ray image results, in accordance with one embodiment of the present disclosure.

FIG. 2 is a flow diagram depicting a method 200 of x-ray imaging and classification, in accordance with one or more embodiments of the present disclosure. It is noted herein that the steps of method 200 may be implemented all or in part by system 100. It is further recognized, however, that the method 200 is not limited to the system 100 in that additional or alternative system-level embodiments may carry out all or part of the steps of method 200. In step 202, one or more volume defects 108 are identified within a three-dimensional structure 113 of a sample 106. In step 204, one or more coherent diffraction images of the one or more identified volume defects 108 are acquired. In step 206, the one or more volume defects 108 within a volume of the three-dimensional structure 113 are classified based on the one or more coherent diffraction images. In step 208, an additional inspection tool is trained based on the one or more classified defects.

Figure 3:
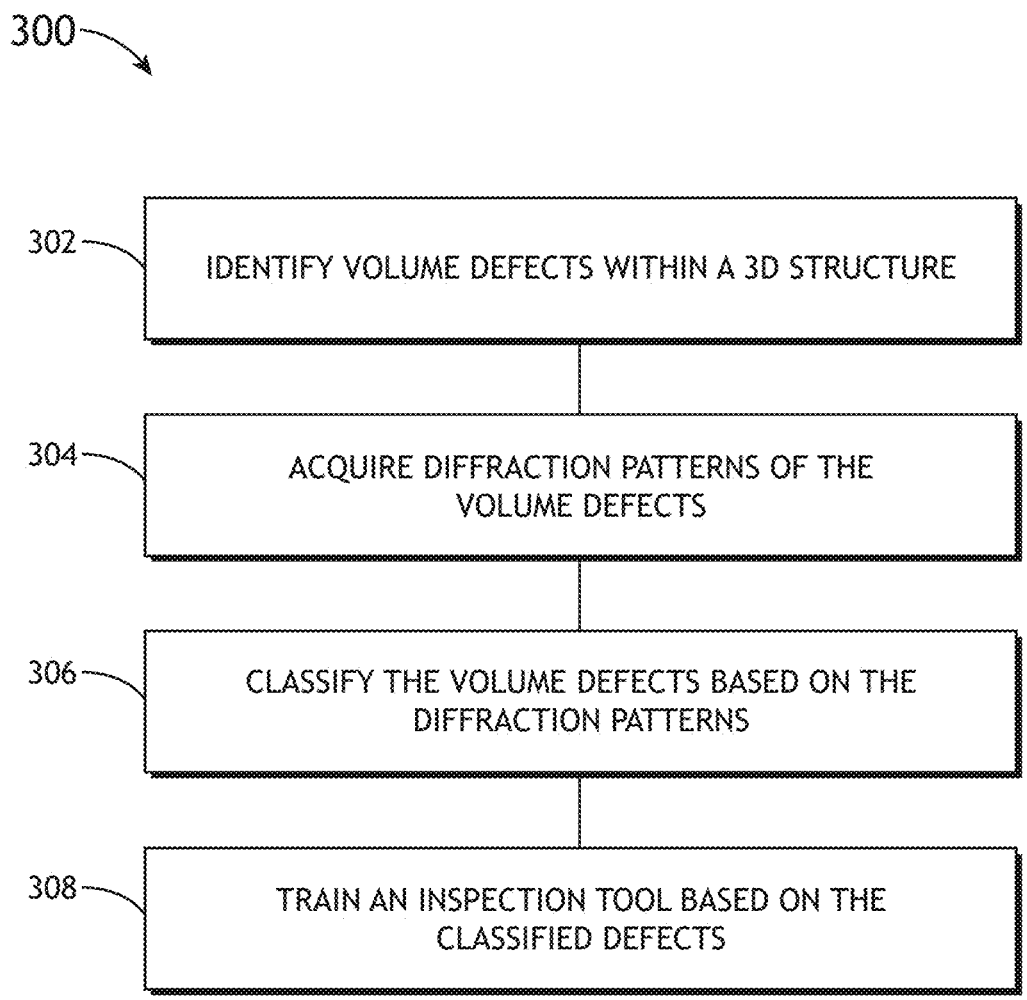
FIG. 3 is a process flow diagram depicting a method of training an inspection tool using x-ray diffraction pattern results, in accordance with one embodiment of the present disclosure.

FIG. 3 is a flow diagram depicting a method 300 of x-ray imaging and classification, in accordance with one or more embodiments of the present disclosure. It is noted herein that the steps of method 300 may be implemented all or in part by system 100. It is further recognized, however, that the method 300 is not limited to the system 100 in that additional or alternative system-level embodiments may carry out all or part of the steps of method 300. In step 302, one or more volume defects 108 are identified within a three-dimensional structure 113 of a sample 106. In step 304, one or more x-ray diffraction patterns 109 associated with the one or more identified volume defects 108 are acquired. In step 306, the one or more volume defects within a volume of the three-dimensional structure 113 are classified based on the one or more x-ray diffraction patterns 109. In step 308, an additional inspection tool 120 is trained based on the one or more classified defects.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
   an x-ray inspection tool comprising an x-ray source and x-ray detector arranged in transmission mode, the x-ray inspection tool configured to measure one or more x-ray diffraction patterns of volume defects contained within a three-dimensional structure of a three-dimensional vertical device;
   an additional inspection tool, the additional inspection tool different from the x-ray inspection tool and configured to detect the volume defects using an additional defect inspection process different than the x-ray inspection tool; and
   one or more controllers including one or more processors communicatively coupled to the x-ray detector and the additional inspection tool, the one or more processors configured to execute program instructions configured to cause the one or more processors to classify one or more volume defects on one or more test samples based on at least one of the one or more x-ray diffraction patterns from the x-ray inspection tool or one or more coherent diffraction images reconstructed from the one or more x-ray diffraction patterns, wherein the one or more processors are further configured to train the additional inspection tool to detect future defects of the same classifications as the classified defects by correlating the at least one of the one or more x-ray diffraction patterns or the one or more coherent diffraction images with defect detection data of the one or more volume defects on the one or more test samples generated by the additional inspection tool with the additional defect inspection process,
   wherein the additional inspection tool is configured to monitor yield during manufacture of three-dimensional vertical devices by detecting defects in one or more future samples different than the one or more test samples using the additional defect inspection process without the x-ray inspection tool following the training of the additional inspection tool.

2. The system of claim 1, wherein the three-dimensional structure comprises:
   a three-dimensional vertical memory structure.

3. The system of claim 1, wherein the three-dimensional vertical memory structure is disposed on a silicon substrate.

4. The system of claim 3, wherein the silicon substrate is back-thinned to a thickness less than 20 μm.

5. The system of claim 3, wherein the silicon substrate is not thinned and has a thickness of approximately 700 μm.

6. The system of claim 1, wherein the three-dimensional structure includes two or more stacked layers.

7. The system of claim 1, wherein the three-dimensional structure is composed of at least one of $SiO_2$, $SiN_4$, poly silicon, amorphous silicon, or W.

8. The system of claim 1, wherein the one or more volume defects comprise:
   at least one of a material void, a volume of residue material, a volume of extraneous material, or a metrologic variation.

9. The system of claim 1, wherein the x-ray source comprises:
   at least one of a laser produced plasma x-ray source or a Compton x-ray source.

10. The system of claim 1, wherein the x-ray beam has an energy between 3 and 20 keV.

11. The system of claim 1, wherein the additional inspection tool comprises:
at least one of a near infrared (NIR) inspection tool, an electron beam inspection tool, a visible inspection tool, an ultraviolet (UV) inspection tool, or a deep ultraviolet (DUV) inspection tool.

12. The system of claim 1, wherein the one or more processors are configured to receive locations associated with the one or more volume defects within the three-dimensional structure of the one or more samples from the additional inspection tool.

13. The system of claim 1, wherein the one or more processors are configured to receive locations associated with the one or more volume defects within the three-dimensional structure of the one or more samples from a design data source.

14. The system of claim 1, wherein the x-ray inspection tool is configured to acquire two or more x-ray diffraction patterns at a location associated with the one or more volume defects, wherein the two or more x-ray diffraction patterns are acquired at different angles of incidence.

15. The system of claim 14, wherein the classifying the one or more volume defects based on at least one of the one or more x-ray diffraction patterns or the one or more coherent diffraction images reconstructed from the one or more x-ray diffraction patterns comprises:
classifying the one or more volume defects based on one or more coherent diffraction images reconstructed from the two or more x-ray diffraction patterns.

16. The system of claim 15, wherein the classifying the one or more volume defects based on one or more coherent diffraction images reconstructed from the two or more x-ray diffraction patterns comprises:
classifying the one or more volume defects based on one or more coherent diffraction images reconstructed from two or more x-ray diffractions, wherein a number of different angles of incidence is less than 10.

17. The system of claim 16, wherein the classifying the one or more volume defects based on one or more coherent diffraction images reconstructed from the two or more x-ray diffractions, wherein a number of different angles of incidence is less than 10 comprises:
classifying the one or more volume defects based on one or more coherent diffraction images reconstructed from two or more x-ray diffractions, wherein a number of different angles of incidence is the minimal number of angles of incidence to reconstruct a coherent diffraction image.

18. An x-ray inspection tool comprising:
an x-ray source;
an x-ray detector, wherein the x-ray source and the x-ray detector are arranged in transmission mode and configured to measure one or more x-ray diffraction patterns from volume defects contained within a three-dimensional structure of a three-dimensional vertical device; and
one or more controllers including one or more processors communicatively coupled to the x-ray detector, the one or more processors configured to execute program instructions configured to cause the one or more processors to classify one or more volume defects on one or more test samples based on at least one of one or more x-ray diffraction patterns or one or more coherent diffraction images reconstructed from the one or more x-ray diffraction patterns, wherein the one or more processors are further configured to train one or more additional inspection tools to detect future defects of the same classifications as the classified defects by correlating the at least one of the one or more x-ray diffraction patterns or the one or more coherent diffraction images with defect detection data of the one or more volume defects on the one or more test samples generated by the one or more additional inspection tool with additional defect inspection processes, wherein the one or more additional inspection tools are configured to monitor yield during manufacture of three-dimensional vertical devices by detecting the defects in one or more future samples different than the one or more test samples using the one or more additional defect inspection processes without the x-ray inspection tool following training of the additional inspection tool.

19. A system comprising:
an x-ray inspection tool comprising:
a sample stage configured to secure a three-dimensional vertical device including one or more volume defects embedded within a three-dimensional structure of the three-dimensional vertical device;
an x-ray source configured to generate an x-ray beam; and
an x-ray detector,
wherein the x-ray source and the x-ray detector are arranged in transmission mode, wherein the x-ray source is configured to transmit the x-ray beam through a sample, wherein the detector is configured to measure x-ray diffraction patterns caused by volume defects;
an additional inspection tool, the additional inspection tool different from the x-ray inspection tool and configured to detect the volume defects using an additional defect inspection process different than the x-ray inspection tool; and
one or more controllers including one or more processors communicatively coupled to the x-ray detector and the additional inspection tool, the one or more processors configured to execute program instructions configured to cause the one or more processors to:
receive a location associated with the one or more volume defects within a three-dimensional structure of the sample;
direct the x-ray inspection tool to acquire one or more x-ray diffraction patterns at the locations associated with the one or more volume defects;
classify the one or more volume defects based on at least one of the one or more x-ray diffraction patterns or one or more coherent diffraction images reconstructed from the one or more x-ray diffraction patterns; and
train the additional inspection tool to detect future defects of the same classifications as the classified defects by correlating the at least one of the one or more x-ray diffraction patterns or the one or more coherent diffraction images with defect detection data of the one or more volume defects on one or more test samples generated by the additional inspection tool with the additional defect inspection process, wherein the additional inspection tool is configured to monitor yield during manufacture of three-dimensional vertical devices by detecting defects in one or more future samples different than the one or more test samples using the additional defect inspection process without the x-ray inspection tool following training of the additional inspection tool.

20. The system of claim 19, wherein the three-dimensional structure comprises:
a three-dimensional vertical memory structure.

21. The system of claim 20, wherein the three-dimensional vertical memory structure is disposed on a silicon substrate.

22. The system of claim 21, wherein the silicon substrate is back-thinned to a thickness less than 20 μm.

23. The system of claim 21, wherein the silicon substrate is not thinned and has a thickness of approximately 700 μm.

24. The system of claim 19, wherein the three-dimensional structure includes two or more stacked layers.

25. The system of claim 19, wherein the three-dimensional structure is composed of at least one of SiO2, SiN4, poly silicon, amorphous silicon, or W.

26. The system of claim 19, wherein the one or more volume defects comprise:
at least one of a material void, a volume of residue material, a volume of extraneous material, or a metrological variation.

27. The system of claim 19, wherein the x-ray source comprises:
at least one of a laser produced plasma x-ray source or a Compton x-ray source.

28. The system of claim 19, wherein the x-ray beam has an energy between 3 and 20 keV.

29. The system of claim 19, wherein the additional inspection tool comprises:
at least one of a near infrared (NIR) inspection tool, an electron beam inspection tool, a visible inspection tool, an ultraviolet (UV) inspection tool, or a deep ultraviolet (DUV) inspection tool.

30. The system of claim 19, wherein the one or more processors are configured to receive the locations a location associated with the one or more volume defects within the three-dimensional structure of the one or more test samples from the additional inspection tool.

31. The system of claim 19, wherein the one or more processors are configured to receive the locations associated with the one or more volume defects within the three-dimensional structure of the one or more test samples from a design data source.

32. The system of claim 19, wherein the classifying the one or more volume defects based on at least one of the one or more x-ray diffraction patterns or the one or more coherent diffraction images reconstructed from the one or more x-ray diffraction patterns comprises:
rendering one or more expected images of the three-dimensional structure at the locations of the one or more identified volume defects based on at least one of one or more characteristics of the x-ray source or one or more characteristics contained within design data associated with the one or more test samples;
comparing the one or more rendered expected images to the one or more reconstructed coherent diffraction images of the one or more identified volume defects to identify one or more differences between the one or more rendered expected images and the one or more reconstructed coherent diffraction images; and
classifying the one or more identified volume defects based on the one or more differences between the one or more rendered expected images and the one or more reconstructed coherent diffraction images.

33. The system of claim 19, wherein the classifying the one or more volume defects based on at least one of the one or more x-ray diffraction patterns or one or more coherent diffraction images reconstructed from the one or more x-ray diffraction patterns comprises:
rendering one or more expected diffraction patterns of the three-dimensional structure at the locations of the one or more identified volume defects based on at least one of one or more characteristics of the x-ray source or one or more characteristics contained within design data associated with the one or more test samples;
comparing the one or more rendered expected diffraction patterns to the one or more x-ray diffraction patterns of the one or more identified volume defects to identify one or more differences between the one or more rendered expected diffraction patterns and the one or more x-ray diffraction patterns; and
classifying the one or more identified volume defects based on the one or more differences between the one or more rendered expected diffraction patterns and the one or more x-ray diffraction patterns.

34. The system of claim 19, wherein the x-ray inspection tool acquires two or more x-ray diffraction patterns at the locations associated with the one or more volume defects, wherein the two or more x-ray diffraction patterns are acquired at different angles of incidence.

35. The system of claim 34, wherein the classifying the one or more volume defects based on at least one of the one or more x-ray diffraction patterns or one or more coherent diffraction images reconstructed from the one or more x-ray diffraction patterns comprises:
classifying the one or more volume defects based on one or more coherent diffraction images reconstructed from the two or more x-ray diffraction patterns.

36. The system of claim 35, wherein the classifying the one or more volume defects based on one or more coherent diffraction images reconstructed from the two or more x-ray diffraction patterns comprises:
classifying the one or more volume defects based on one or more coherent diffraction images reconstructed from two or more x-ray diffractions, wherein a number of different angles of incidence is less than 10.

37. The system of claim 36, wherein the classifying the one or more volume defects based on one or more coherent diffraction images reconstructed from the two or more x-ray diffractions, wherein a number of different angles of incidence is less than 10 comprises:
classifying the one or more volume defects based on one or more coherent diffraction images reconstructed from the two or more x-ray diffractions, wherein a number of different angles of incidence is the minimal number of angles of incidence to reconstruct a coherent diffraction image.

38. The system of claim 19, wherein the classifying the one or more volume defects based on at least one of the one or more x-ray diffraction patterns or one or more coherent diffraction images reconstructed from the one or more x-ray diffraction patterns comprises:
determining at least one of a depth of the one or more volume defects or a type of the one or more volume defects.

39. The system of claim 19, wherein the detector comprises:
an x-ray charge coupled device (CCD).

40. A method comprising:
identifying one or more volume defects within a three-dimensional structure of a three-dimensional vertical device on one or more test samples;
acquiring, with a transmission-mode x-ray diffraction inspection tool, one or more coherent diffraction images of the one or more identified volume defects;
classifying the one or more volume defects within a volume of the three-dimensional structure based on the one or more coherent diffraction images;
training an additional inspection tool different from the transmission-mode x-ray diffraction inspection tool to detect future defects of the same classifications as the classified defects by correlating the at least one of one or more x-ray diffraction patterns or the one or more coherent diffraction images with defect detection data of the one or more volume defects on the one or more test samples generated by the additional inspection tool with an additional defect inspection process; and
following training of the additional inspection tool, monitoring or maintaining yield during manufacture of three-dimensional vertical devices by classifying defects in one or more future samples different than the one or more test samples using the additional defect inspection process without the x-ray inspection tool.

41. The method of claim 40, wherein the three-dimensional structure comprises:
a three-dimensional vertical memory structure.

42. The method of claim 41, wherein the three-dimensional vertical memory structure is disposed on a silicon substrate.

43. The method of claim 42, wherein the silicon substrate is back-thinned to a thickness less than 20 μm.

44. The method of claim 42, wherein the silicon substrate is not thinned and has a thickness of approximately 700 μm.

45. The method of claim 40, wherein the one or more volume defects comprise:
at least one of a material void, a volume of residue material, a volume of extraneous material, or a metrological variation.

46. The method of claim 40, wherein the identifying one or more volume defects within the three-dimensional structure comprises:
identifying one or more volume defects within a three-dimensional structure with the additional inspection tool.

47. The method of claim 46, wherein the identifying one or more volume defects within a three-dimensional structure with the additional inspection tool comprises:
identifying one or more volume defects within a three-dimensional structure with at least one of a near infrared (NIR) inspection tool, an electron beam inspection tool, a visible inspection tool, an ultraviolet (UV) inspection tool, or a deep ultraviolet (DUV) inspection tool.

48. The method of claim 40, wherein the identifying one or more volume defects within a three-dimensional structure comprises:
identifying one or more volume defects within a three-dimensional structure via design data associated with the one or more three-dimensional structures of the one or more test samples.

49. The method of claim 40, wherein the acquiring one or more coherent diffraction images of the one or more identified volume defects comprises:
transmitting an x-ray beam through the one or more identified volume defects;
measuring one or more diffraction patterns caused by the one or more identified volume defects; and
reconstructing the one or more coherent diffraction images of the one or more identified volume defects based on the one or more measured diffraction patterns of the one or more identified volume defects.

50. The method of claim 49, wherein the classifying the one or more volume defects within a volume of the three-dimensional structure based on the one or more coherent diffraction images comprises:
rendering one or more expected images of the three-dimensional structure at one or more locations of the one or more identified volume defects based on at least one of one or more characteristics of the x-ray source or one or more characteristics contained within design data associated with the one or more test samples;
comparing the one or more rendered expected images to the one or more reconstructed coherent diffraction images of the one or more identified volume defects to identify one or more differences between the one or more rendered expected images and the one or more reconstructed coherent diffraction images; and
classifying the one or more identified volume defects based on the one or more differences between the one or more rendered expected images and the one or more reconstructed coherent diffraction images.

51. The method of claim 50, wherein the classifying the one or more identified volume defects based on the one or more differences between the one or more rendered expected images and the one or more reconstructed coherent diffraction images comprises:
determining at least one of a depth or type of the one or more identified volume defects based on the one or more identified differences between the one or more rendered expected images and the one or more reconstructed coherent diffraction images.

* * * * *